United States Patent
Gao et al.

(10) Patent No.: US 8,739,090 B1
(45) Date of Patent: May 27, 2014

(54) PROBE SIGNAL COMPRESSION METHOD AND APPARATUS FOR HARDWARE BASED VERIFICATION PLATFORMS

(71) Applicant: Cadence Design Systems, Inc., San Jose, CA (US)

(72) Inventors: Jingbo Gao, San Jose, CA (US); Tsair-Chin Lin, Saratoga, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 13/903,672

(22) Filed: May 28, 2013

Related U.S. Application Data

(60) Provisional application No. 61/799,979, filed on Mar. 15, 2013.

(51) Int. Cl.
*G06F 17/50* (2006.01)
*G06F 11/26* (2006.01)

(52) U.S. Cl.
CPC .......... *G06F 11/261* (2013.01); *G06F 17/5022* (2013.01); *G06F 17/5027* (2013.01)
USPC .............................. 716/106; 716/136; 703/23

(58) Field of Classification Search
None
See application file for complete search history.

(56) References Cited

U.S. PATENT DOCUMENTS

| | | | |
|---|---|---|---|
| 7,571,400 B2 * | 8/2009 | Park et al. ...................... | 716/136 |
| 8,341,570 B2 * | 12/2012 | Jain et al. ....................... | 716/106 |
| 2007/0168790 A1 * | 7/2007 | Cooper et al. ................. | 714/724 |
| 2011/0307233 A1 * | 12/2011 | Tseng et al. .................... | 703/14 |

* cited by examiner

*Primary Examiner* — Leigh Garbowski
(74) *Attorney, Agent, or Firm* — Dickstein Shapiro LLP

(57) ABSTRACT

The present patent document relates a method and apparatus for compressing probe system data in hardware functional verification systems used to verify user logic designs. Such systems can create large amounts of data every data cycle, which can include many bits that do not toggle from one cycle to the next. Compressing such data is possible by arranging the data in bytes and determining which bytes contain bits that have changed. A status byte may be generated that conveys which bytes contain changed bits. Together the status byte and only the bytes that contain changed bits are transmitted to a host workstation, saving bandwidth on the communication interface.

28 Claims, 6 Drawing Sheets

US 8,739,090 B1

PROBE SIGNAL COMPRESSION METHOD AND APPARATUS FOR HARDWARE BASED VERIFICATION PLATFORMS

CROSS-REFERENCE TO RELATED APPLICATION

This application claims the benefit of Provisional Application No. 61/799,979, filed Mar. 15, 2013. Priority to this provisional application is expressly claimed, and the disclosure of the provisional application is hereby incorporated herein by reference in its entirety.

FIELD

The present patent document relates generally to verifying the functionality of integrated circuit designs prior to fabrication. In particular, the present patent document relates to a method and apparatus for compressing probe system data in hardware functional verification systems.

BACKGROUND

Hardware functional verification systems ("emulators" or "emulation systems") utilize arrays of processing devices or programmable logic devices, and are used to verify circuit designs. A common method of design verification is to use hardware emulators to emulate the circuit design prior to physically manufacturing the integrated circuit of the hardware. Processor-based emulators sequentially evaluate combinatorial logic levels in the design under verification, starting at the inputs and proceeding to the outputs. Hardware emulators, both processor-based and programmable logic device-based, allow engineers and hardware designers to test and verify the operation of an integrated circuit, an entire board of integrated circuits, or an entire system without having to first physically fabricate and manufacture the electronic hardware.

Debugging a logic design is the search for and correction of errors in the design. To improve debugging of the user's circuit design, full visibility into the circuit design being verified is desired. Full visibility means that the user of the emulator can get waveform data for all signals in their design, regardless of where in the circuit that signal is found. Such full visibility can require the emulator to handle huge amounts of waveform data, also known as probe data. For example, if a user design contains ten million gates, the waveform for one million cycles would include ten trillion bits, using the assumption that each signal requires a single bit in each cycle. This data will need to be moved from the emulator to the user's workstation in order to generate a waveform for the user.

SUMMARY

A method and apparatus for compressing probe system data in hardware functional verification systems is disclosed.

In an embodiment a computer-implemented method comprises running a first emulation cycle for a circuit design under test to generate a first plurality of emulation bits representing waveform data captured from at least one net of the circuit design under test at a first time; organizing the first plurality of emulation bits into a first plurality of emulation bytes; running a second emulation cycle for the circuit design under test to generate a second plurality of emulation bits representing waveform data captured from the at least one net of the circuit design under test at a second time; organizing the second plurality of emulation bits into a second plurality of emulation bytes; comparing the first plurality of emulation bits with the second plurality of emulation bits to generate a plurality of result bytes containing information about which emulation bits have changed value from the first emulation cycle to the second emulation cycle; calculating a status byte containing information about which of the second plurality of emulation bytes contain emulation bits that have changed value; and compressing together the status byte and one of: any one or more emulation bytes of the second plurality of emulation bytes containing bits that have changed value; or any one or more result bytes corresponding to the any one or more emulation bytes.

In an embodiment a computer-readable non-transitory storage medium having stored thereon a plurality of instructions is disclosed. The plurality of instructions when executed by a computer, cause the computer to perform running a first emulation cycle for a circuit design under test to generate a first plurality of emulation bits representing waveform data captured from at least one net of the circuit design under test at a first time; organizing the first plurality of emulation bits into a first plurality of emulation bytes; running a second emulation cycle for the circuit design under test to generate a second plurality of emulation bits representing waveform data captured from the at least one net of the circuit design under test at a second time; organizing the second plurality of emulation bits into a second plurality of emulation bytes; comparing the first plurality of emulation bits with the second plurality of emulation bits to generate a plurality of result bytes containing information about which emulation bits have changed value from the first emulation cycle to the second emulation cycle; calculating a status byte containing information about which of the second plurality of emulation bytes contain emulation bits that have changed value; and compressing together the status byte and one of: any one or more emulation bytes of the second plurality of emulation bytes containing bits that have changed value; or one or more result bytes corresponding to the any one or more emulation bytes.

According to another embodiment, comparing the first plurality of emulation bits with the second plurality of emulation bits comprises performing an XOR operation on the first plurality of emulation bits and the second plurality of emulation bits.

Another embodiment further comprises grouping the second plurality of emulation bytes into a plurality of groups, each group containing a number of emulation bytes, wherein calculating a status byte further comprises calculating a status byte separately for each group of the plurality of groups.

According to another embodiment, the status byte for each group of the plurality of groups comprises a number of status bits that equals the number of emulation bytes in the group.

According to another embodiment, each emulation byte of the first plurality of emulation bytes and the second plurality of emulation bytes comprises eight emulation bits.

Another embodiment further comprises storing the first and second plurality of emulation bits in a memory before comparing the first plurality of emulation bits with the second plurality of emulation bits.

Another embodiment further comprises transmitting the compressed output for receipt by a host workstation without storing the compressed output in the memory.

Another embodiment further comprises storing the compressed output in a memory; and transmitting the compressed output for receipt by a host workstation.

In an embodiment a hardware functional verification system comprises a plurality emulation chips to emulate a circuit design under test and to run a plurality of emulation cycles to generate a first plurality of emulation bits representing waveform data captured from at least one net during a first emulation cycle at a first time and organized into a first plurality of emulation bytes, and to generate a second plurality of emulation bits representing waveform data captured from the at least one net during a second emulation cycle at a second time and organized into a second plurality of emulation bytes; a comparison logic to generate a plurality of result bytes containing information about which emulation bits have changed value from the first emulation cycle to the second emulation cycle by comparing the first plurality of emulation bits to the second plurality of emulation bits; a plurality of logic gates to calculate a status byte containing information about which of the second plurality of emulation bytes contain emulation bits that have changed value; and a compression logic to create a compressed output by compressing together the status byte and one of: any one or more emulation bytes of the second plurality of emulation bytes containing bits that have changed value; or one or more result bytes corresponding to the any one or more emulation bytes.

According to another embodiment, the comparison logic comprises one or more exclusive OR (XOR) circuits.

According to another embodiment, the plurality of logic gates to calculate a status byte comprise a plurality of OR gates.

According to another embodiment, the compression logic comprises a plurality of shift logic.

According to another embodiment, the first plurality of emulation bytes comprise eight emulation bytes, each emulation byte comprising eight emulation bits, and the second plurality of emulation bytes comprise eight emulation bytes, each emulation byte comprising eight emulation bits.

According to another embodiment, the status byte comprises eight bits.

According to another embodiment, the plurality of logic gates to calculate a status byte comprise eight eight-input OR gates.

According to another embodiment, the compression logic is further configured to group the second plurality of emulation bytes into a plurality of groups, and the plurality of logic gates calculate a status byte separately for each group of the plurality of groups.

According to another embodiment, the status byte for each group of the plurality of groups comprises a number of status bits that equals the number of emulation bytes in the group.

Another embodiment further comprises a memory in communication with the compression logic to receive and store the compressed output.

Another embodiment further comprises a memory in communication with the plurality of emulation chips to receive and store the first plurality of emulation bits and the second plurality of emulation bits, and in communication with the compression logic to provide the first and second plurality of emulation bits to the compression logic.

According to another embodiment, the memory comprises a plurality of sub-memories, each sub-memory residing in an emulation chip of the plurality of emulation chips.

The above and other preferred features described herein, including various novel details of implementation and combination of elements, will now be more particularly described with reference to the accompanying drawings and pointed out in the claims. It will be understood that the particular methods and apparatuses are shown by way of illustration only and not as limitations of the claims. As will be understood by those skilled in the art, the principles and features of the teachings herein may be employed in various and numerous embodiments without departing from the scope of the claims.

BRIEF DESCRIPTION OF THE DRAWINGS

The accompanying drawings, which are included as part of the present specification, illustrate the presently preferred embodiments and together with the general description given above and the detailed description of the preferred embodiments given below serve to explain and teach the principles described herein.

Figure 1:
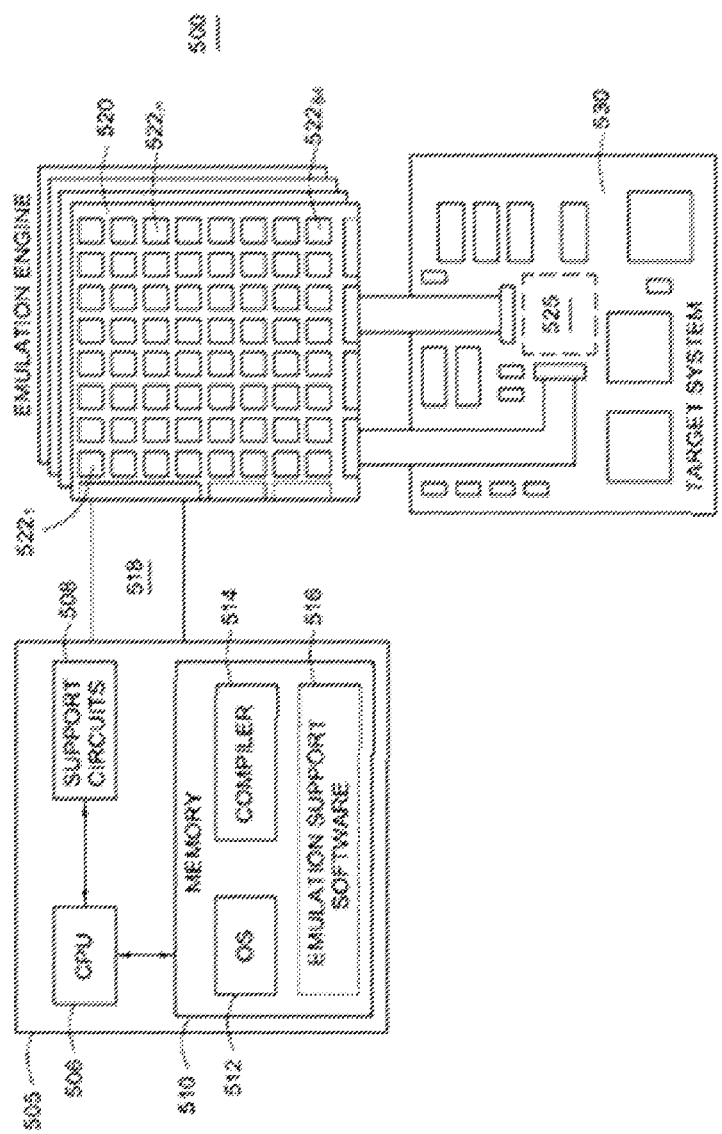
FIG. 1 is an illustration of an overview of an emulation system (hardware functional verification system).

The figures are not necessarily drawn to scale and the elements of similar structures or functions are generally represented by like reference numerals for illustrative purposes throughout the figures. The figures are only intended to facilitate the description of the various embodiments described herein; the figures do not describe every aspect of the teachings disclosed herein and do not limit the scope of the claims.

DETAILED DESCRIPTION

A method and apparatus for compressing probe system data in hardware functional verification systems is disclosed. Each of the features and teachings disclosed herein can be utilized separately or in conjunction with other features and teachings. Representative examples utilizing many of these additional features and teachings, both separately and in combination, are described in further detail with reference to the attached drawings. This detailed description is merely intended to teach a person of skill in the art further details for practicing preferred aspects of the present teachings and is not intended to limit the scope of the claims. Therefore, combinations of features disclosed in the following detailed description may not be necessary to practice the teachings in the broadest sense, and are instead taught merely to describe particularly representative examples of the present teachings.

In the following description, for purposes of explanation only, specific nomenclature is set forth to provide a thorough understanding of the various embodiments described herein. However, it will be apparent to one skilled in the art that these specific details are not required to practice the concepts described herein.

Some portions of the detailed descriptions that follow are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Also disclosed is an apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk, including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, and each coupled to a computer system bus.

The algorithms presented herein are not inherently related to any particular computer or other apparatus. Various general purpose systems may be used with programs in accordance with the teachings herein, or it may prove convenient to construct a more specialized apparatus to perform the required method steps. The required structure for a variety of these systems will appear from the description below. It will be appreciated that a variety of programming languages may be used to implement the present teachings.

Moreover, the various features of the representative examples and the dependent claims may be combined in ways that are not specifically and explicitly enumerated in order to provide additional useful embodiments of the present teachings. It is also expressly noted that all value ranges or indications of groups of entities disclose every possible intermediate value or intermediate entity for the purpose of original disclosure, as well as for the purpose of restricting the claimed subject matter. It is also expressly noted that the dimensions and the shapes of the components shown in the figures are designed to help to understand how the present teachings are practiced, but not intended to limit the dimensions and the shapes shown in the examples.

FIG. 1 depicts an overview of an emulation system (also called a hardware functional verification system) 500, according to an embodiment. The system comprises a host computer workstation 505, an emulation engine including emulation board 520, and a target system 530.

The host workstation 505 provides emulation support facilities to the emulation engine and emulation board 520. The computer workstation 505, for example a personal computer, comprises at least one central processing unit (CPU) 506, support circuits 508, and a memory 510. The CPU 506 may comprise one or more conventionally available microprocessors and/or microcontrollers. The support circuits 508 are well known circuits that are used to support the operation of the CPU 506. These supporting circuits comprise power supplies, clocks, input/output interface circuitry, cache, and other similar circuits. Also included is a mass storage devices such as a hard disk drive, solid state drive, or the like, which can store data as well as software that implements various features of the embodiments described herein.

Memory 510, sometimes referred to as main memory, may comprise random access memory, read only memory, disk memory, flash memory, optical storage, and/or various combinations of these types of memory. Memory 510 may in part be used as cache memory or buffer memory. Memory 510 stores various forms of software and files for the emulation system, such as an operating system (OS) 512, a compiler 514, and emulation support software 516. The compiler 514 converts a hardware design, such as hardware described in VHDL or Verilog, to a sequence of instructions that can be evaluated by the emulation board 520.

The host workstation 505 allows a user to interface with the emulation engine via communications channels 518, including emulation board 520, and configure and control the emulation process and collect emulation results for analysis. The host workstation 505 runs software that configures and manages the allocation of emulation resources. Under control of the host workstation 505, programming information and data is loaded to the emulation engine 500. The emulation board 520 has on it a number of individual emulation chips, for example the sixty-four emulation chips $522_1$ to $522_{64}$ (collectively 522), in addition to miscellaneous support circuitry. The term "emulation chip" is used broadly to include both monolithic integrated circuits as well as multi-chip packages.

In response to programming received from the emulation support software 516, emulation engine emulates a portion 525 of the target system 530. Portion 525 of the target system 530 may be an integrated circuit, a memory, a processor, or any other object or device that may be emulated in a programming language. Exemplary emulation programming languages include Verilog and VHDL.

Emulation can involve a series of cycles, or steps. Each cycle generates a set of data, and the data may be arranged according to cycles and stored in probe capture memory. Compression of this data can be used to reduce the total size of the data, easing the burden of uploading the data to the workstation. Compression, however, is not easy to apply in practice in an emulator. The compression method may be simple to allow it to be implemented in hardware, and also result in a good compression method.

According to an embodiment, sets of data for cycles of emulation are obtained in probe capture and organized cycle by cycle. Most of the signals do not toggle from one cycle to the next. In a first compression step, an exclusive OR (XOR) operation is performed for one cycle with the next cycle. Alternatively, the XOR operation can be performed with the previous cycle. The resulting data set, assuming most signals do not toggle, are mostly bits having a value of zero. Organizing the resulting data set into bytes can yield certain bytes having only zero-valued bits, and certain bytes containing one or more bits having a value of one. A status byte is then created, the status byte indicating which bytes contain only zero-valued bits, and which bytes contain one or more bits having a value of one. The bytes containing one or more bits having a value of one are then associated with the status byte, creating a compressed output. Since few numbers of signals toggle from one cycle to the next, the compressed output will likely be smaller than the uncompressed data set it replaces.

Figure 2:
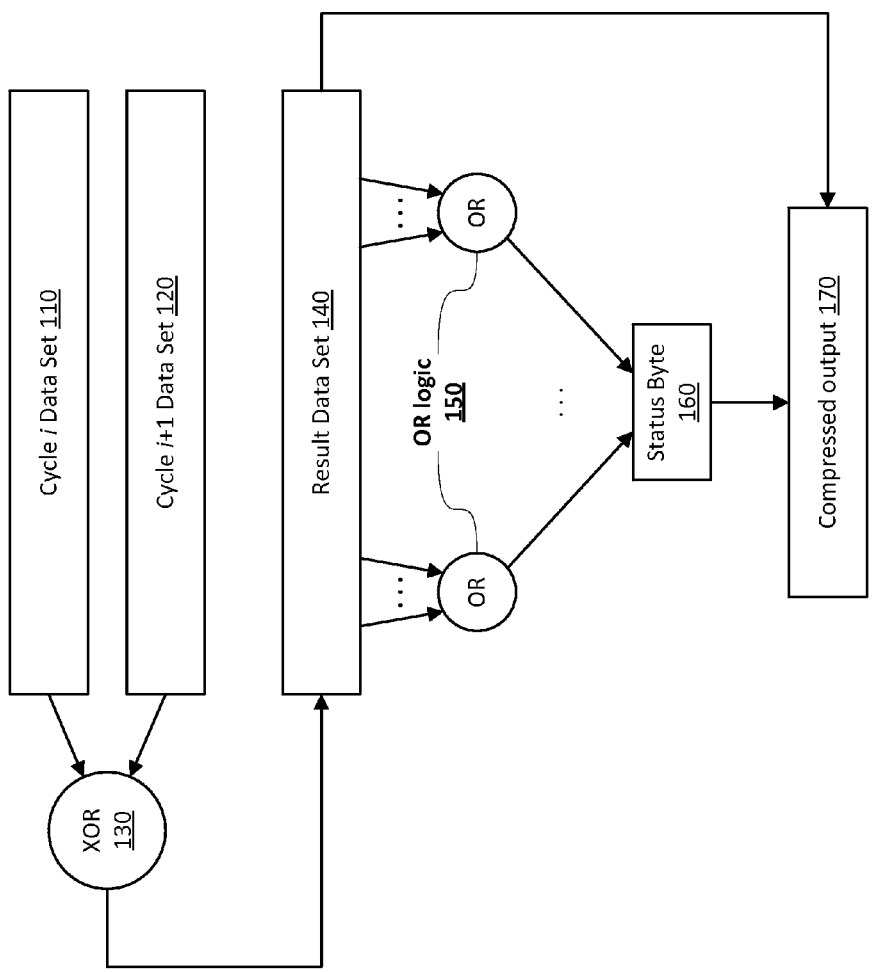
FIG. 2 is an illustration of compression for a cycle of functional verification data having arbitrary size according to an embodiment.

FIG. 2 illustrates a compression method according to an embodiment. Cycle i data set 110 is a data set output from a single cycle of an emulator for a circuit design. Here, data set 110 is the ith cycle. The data set is stored in probe capture memory and organized cycle by cycle. Data set 110 can be arranged in an array of M bytes, each byte having an arbitrary number of bits N. For example, a sixty-four bit data set 110 can have eight bytes of eight bits per byte. Or, for example, a sixty-four bit data set 110 can have sixteen bytes of four bits per byte. The next data set output is cycle i+1 data set 120 is also stored in probe capture memory and has the same byte structure as the ith data set 110, that is, the bits of data set 110 line up with the bits of data set 120. By performing a bitwise XOR operation with XOR logic 130, a result data set 140 is generated. This result data set 140 will likewise be structured according to the same byte structure as data set 110 and data set 120. In the results data set 140, each bit has a value of zero for each bit position where the bit did not toggle between data set 110 and data set 120, and a value of one for each bit position where the bit toggled between data set 110 and data set 120.

Having now performed an operation to produce the result data set 140, a status bit can be calculated for each byte of the result data set 140 by performing OR operations with OR gates 150, each having a multiplicity of inputs. Each bit of the first byte of result data set 140 can be one input of a first OR gate. Each bit of the second byte of result data set 140 is one input of a second OR gate, and so on for each byte of the result data set. The number of OR gates for OR logic 150 can be the number of bytes in result data set 140. With OR logic 150, if at least one of the bits of the byte has a value of one, the OR operation will return a value of one. However, if all of the bits of the result data byte have a value of zero, the OR operation will return a value of zero. Each status bit is included in the status byte, the status byte in the whole indicating which bytes contain any toggled bit values, and which bytes contain no toggled bit value.

With the status byte 160 calculated, it may be put into the compressed output 170. Each of the bytes of the result data set 140 having any non-zero value bits are then put into the compressed output 170. Thus, the length of compressed output 170 may not be the same from one cycle of data to the next. If no bits toggle between data set 110 and data set 120, then all bits of results data set 140 will have a value of zero, and the length of the compressed output 170 can be just one byte (the status byte). If at least one bit toggles in each byte between data set 110 and data set 120, then all bits of status byte 160 can have a value of one, and the length of the compressed output 170 can be the length of all the bytes of the result data set 140 plus the status byte.

In an embodiment, the compressed output can be constructed using shift logic controlled by the status byte to shift non-zero input bytes to the output. This shift logic can comprise a number of synthesized combinatorial gates programmed in the functional verification system. The shift logic shifts out only those bytes of the data set for which the status byte contains a value of one in the position for that data set byte. A shift logic module can be written comprising a set of cases, for example in Verilog, where each status byte configuration comprises a case, and shifts out the corresponding data set bytes. For example, where a data set has eight data set bytes (and thus an eight-bit status byte), two hundred fifty-six cases are possible. Each case assigns to the output data set bytes corresponding to the bits having a value of one in the status byte. Using this shifter, the correct data set bytes (those bytes having any toggled bits) may be shifted to the output within a clock cycle. According to alternative embodiments, other numbers of bytes may be used in the data set, thus changing the size of the status byte, and the corresponding shift logic may be more complicated (for example for a larger status byte length) or may be less complicated (for example for a smaller status byte length).

According to this embodiment, the data set of each cycle are arranged in an array of bytes M, each byte having an arbitrary number of bits N. In such case, the status byte would have a bit length M, where M is at least the number of bytes in the array of bytes. The length of the status byte may be the same as (M=N) or different from (M≠N) the length of the bytes in the array of bytes for the data set for each cycle, depending on the particular byte length used. In general for a particular data set, if the number of bits per byte N of the data set is smaller, the status byte length M will be larger, and if on the other hand the number of bits per byte N of the data set is larger, the status byte length M will be smaller. Selecting a value for N that is larger may improve the compression ratio, but may also increase the implementation complexity for both the hardware compression logic on the emulator side and the software decompression on the workstation side. Here the length of the compressed output may vary between one byte (the status byte) and the number of bytes plus one (in the circumstance where each byte contains at least one bit that is toggled).

Figure 3:
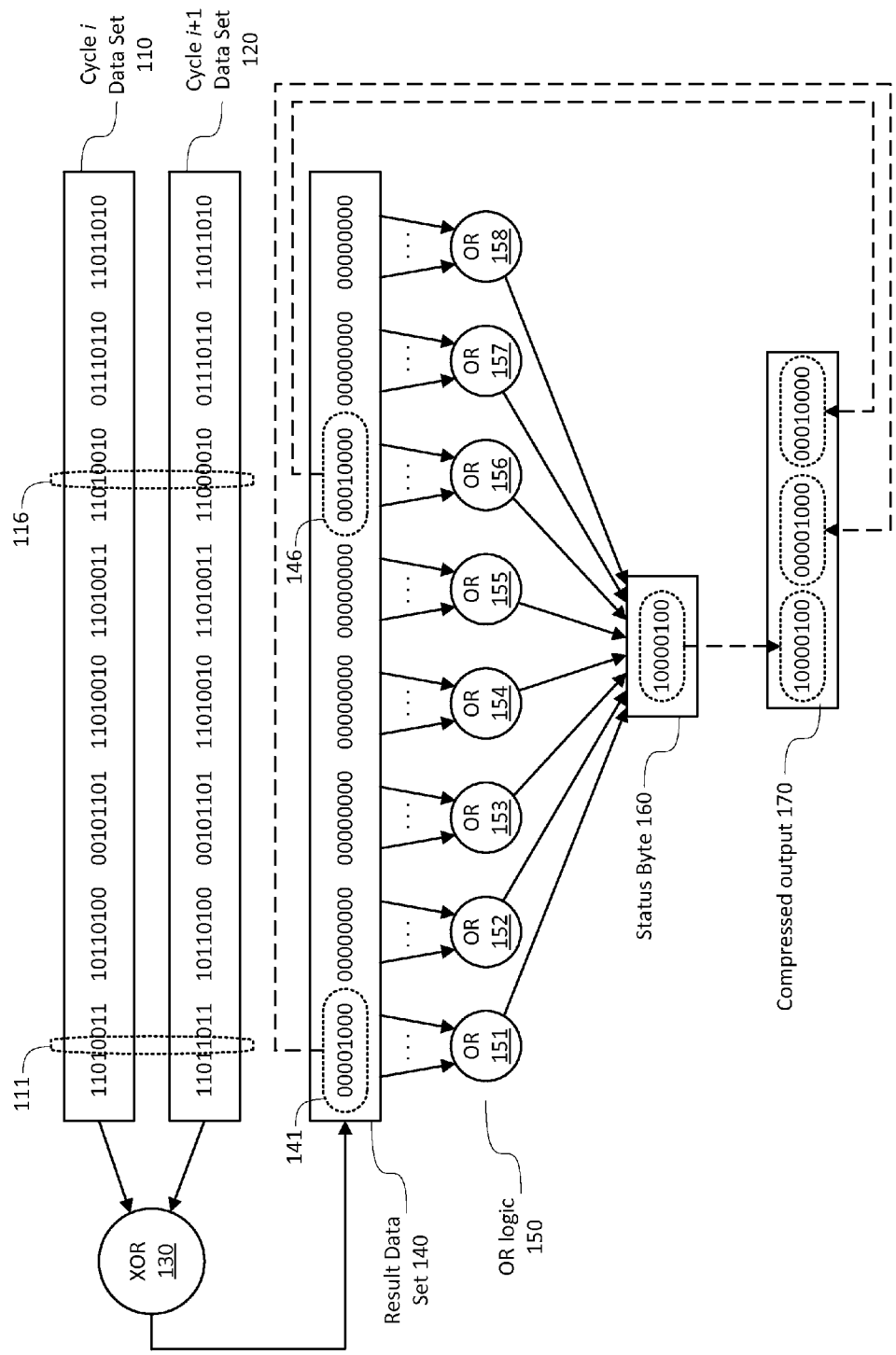
FIG. 3 is an illustration of compression for sixty-four bits of a cycle of functional verification data according to an embodiment.

FIG. 3 illustrates an exemplary embodiment having certain values for the data sets 110 and 120. The particular data illustrated is not material, but is used to further explain the embodiments. An exemplary sixty-four bits in data set 110 are illustrated. The data set is treated as an array of eight bytes, each byte having eight bits each. Here, the bit values of data set 110 are as follows (in hexadecimal): 0xd3, 0xb4, 0x2d, 0xd2, 0xd3, 0xd2, 0x76, 0xda. The bit values of data set 120 are: 0xdb, 0xb4, 0x2d, 0xd2, 0xd3, 0xc2, 0x76, 0xda. Between data set 110 and data set 120 only two bits have toggled, the bit at position 111 (the fifth bit of the first byte, reading the data set from left to right) and the bit at position 116 (the fourth bit of the fifth byte). After performing a bitwise XOR operation using XOR logic 130, the result data set 140 has bit values as follows: 0x08, 0x00, 0x00, 0x00, 0x00, 0x10, 0x00, 0x00. Thus, the fifth bit position of the first byte 141 has a value of one, and the fourth bit position of the fifth byte 146 has a value of one. Each of the remaining bits of result data set 140 have a value of zero. Because the byte structure of the data sets comprises eight bytes of eight bits each, OR logic 150 comprises eight OR gates 151 through 158, where each OR gate has eight inputs, and returns a single bit value according to an OR operation. Each bit of the corresponding byte in the result data set 140 is an input in each OR gate. Thus, OR logic 151 operates on the eight bits of byte 141 to return a value of one, this bit value of one is included in status byte 160. This "one" is in the first bit position (reading from left to right) of status byte 160. Each of OR gates 152 to 155 return a value of zero included in status byte 160 at bit positions two through five (reading the status byte from left to right). OR gate 156 returns a value of one because there is at least a single bit having value of one in result data set byte 146. This value of one is included in bit position six of status byte 160. Each of OR gates 157 and 158 return a value of zero and fill in bits positions seven and eight of status byte 160. Status byte 160 then has the value 0x84. To generate the compressed output 170, the first byte 141 of result data set 140 and the sixth byte 146 of result data set 140 are added to status byte 160, and thus the compressed output 170 has the following contents for this particular data cycle: 0x84, 0x08, 0x10.

FIG. 2 illustrates the creation of a compressed output for a single cycle (using a prior cycle), which will typically be just one among many cycles. Thus there may be a next data set for cycle i+2 resulting in a further compressed output. This further compressed output may be three bytes in length, for example 0x84, 0x08, 0x10, or the compressed output may be of different length depending on which bits toggle between cycle i+1 and cycle i+2. Where a sixty-four bit data set structured as eight bytes, each byte having eight bits, as in FIG. 3, the length of compressed output 170 may vary between a minimum of one byte and a maximum of nine bytes. The compressed output is one byte (the status byte) where no bits toggle between data set 110 and data set 120. The compressed output is nine bytes (the status byte plus each of the other eight bytes) where at least one bit of every byte toggles between data set 110 and data set 120.

Figure 4:
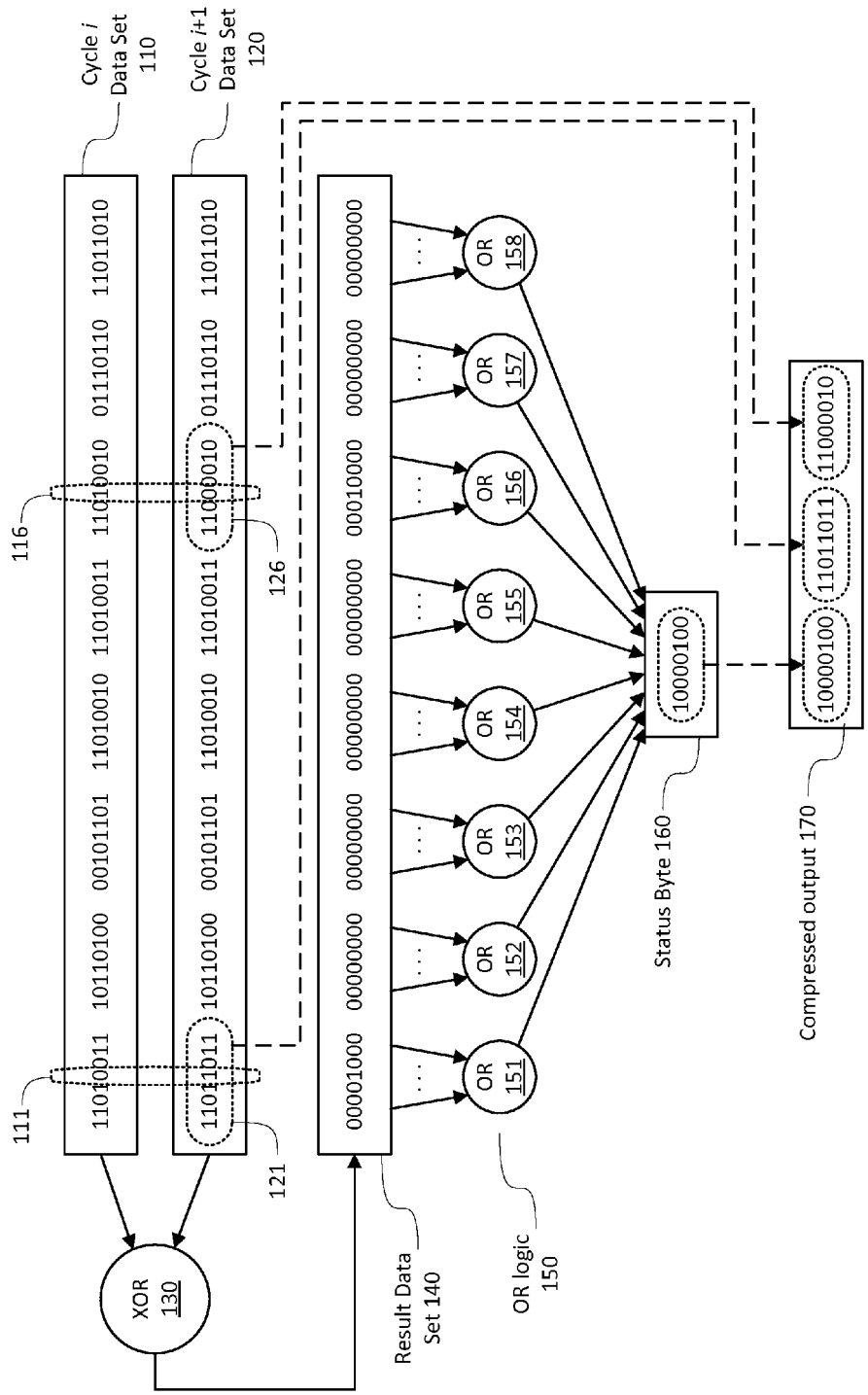
FIG. 4 is an illustration of compression for sixty-four bits of a cycle of functional verification data according to an embodiment.

FIG. 4 illustrates an exemplary embodiment employing an alternative form of compression. As in FIG. 3 and the accompanying description above, the exemplary bit values of data set 110 are 0xd3, 0xb4, 0x2d, 0xd2, 0xd3, 0xd2, 0x76, 0xda, and the bit values of data set 120 are 0xdb, 0xb4, 0x2d, 0xd2, 0xd3, 0xc2, 0x76, 0xda. The calculated status byte 160 is thus the same: 0x84. However, to generate the compressed output 170, the first byte 121 and the sixth byte 126 of the second data set 120 are added to status byte 160. Thus, the compressed output 170 has the following contents for this alternative embodiment: 0x84, 0xdb, 0xc2. This alternative compression method is another valid method using the status byte.

According to an embodiment, a data set containing sixty-four bits can be organized into four bytes, each byte comprising sixteen bits. Here the status byte will have a bit length of four. If a data set has only a single bit toggle from an initial data set, then the compressed output will comprise twenty bits: the four bits of the status byte, plus the sixteen bits of the byte containing the toggled bit.

According to another embodiment, a data set for one cycle may be split into multiple groups for compression. For example, a data set comprising sixty-four bits may be split into two thirty-two bit groups, each thirty-two bit group comprising four bytes of eight bits each. In such case, two status bytes may be generated, each status byte comprising four bits. The resultant compressed data then can vary from one byte (the status byte alone; no bits toggle between data cycles) to five bytes (the status byte plus each of the result data bytes; at least one bit toggles between data cycles for each data byte).

The data set for a particular cycle need not be divided into groups of the same size. The data set groups can be of different length, for example a data set may comprise one hundred sixty bits. This data set may be grouped into three groups: a first group comprising eight bytes of eight bits each; a second group comprising eight bytes of eight bits each; and a third group comprising four bytes of eight bits each. A bitwise XOR operation may still be used to generate a result data set (also having three corresponding groups) and find toggled bits within the bytes. A status byte can be calculated separately for each data set group, resulting in three status bytes. Three compressed outputs are then assembled, one for each group. Each compressed output starts with the status byte, followed by any bytes from its corresponding data set group having any toggled bits.

Figure 5:
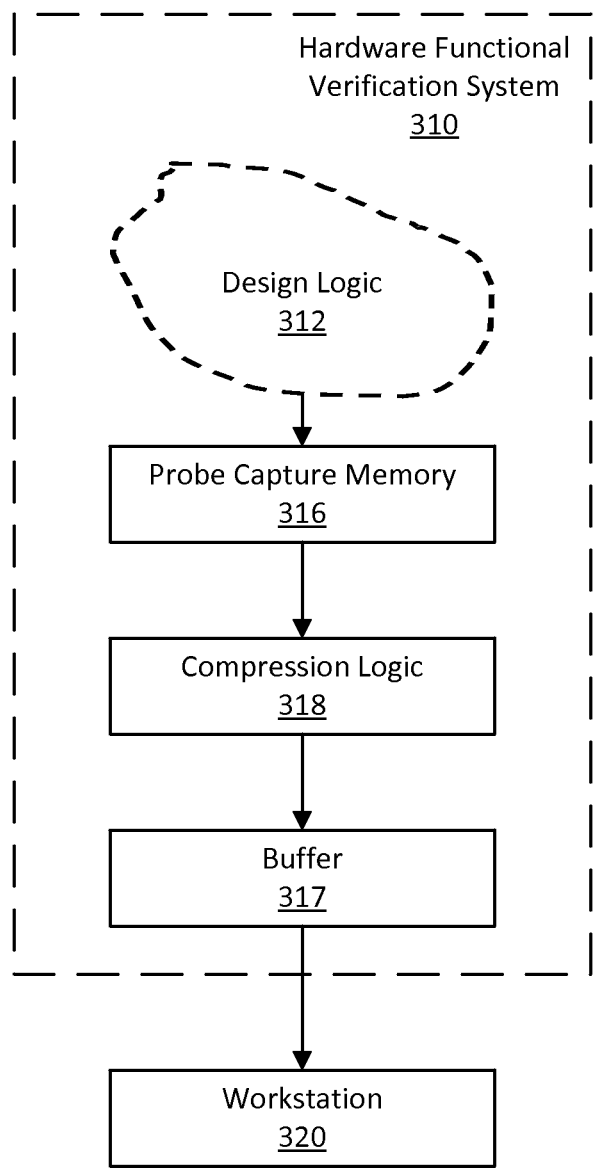
FIG. 5 is an illustration of a hardware functional verification system employing compression according to an embodiment.

According to an embodiment, waveform data may be stored in probe capture memory ("PCM") as uncompressed data generated by the design logic under test. This uncompressed data may be organized cycle by cycle in the PCM. FIG. 5 illustrates an architecture for waveform data captured and stored in PCM 316, and thereafter compressed. PCM 316 can be RAM, such as DDR RAM, or other storage suitable for temporarily storing captured data. The waveform data can be generated in cycles by design logic 312 running in hardware functional verification system 310, which outputs raw data sets in cycles, each cycle saved in PCM 316 as it is generated. Sometime after it is initially stored, the raw data sets can be compressed according to the disclosed embodiments using compression logic 318. The compressed data sets are stored back into another portion of PCM 316, then transmitted from the hardware functional verification system to workstation 320 for the user to observe.

Additional control logic may be used with the compression logic when compressing the waveform data prior to sending the waveform data to the workstation, according to another embodiment. This control logic can control the compression logic to read the uncompressed data stored in the PCM 316 a single time, without having to store the compressed data back into the PCM 316 prior to sending to the workstation. Because PCM 316 can read data quickly, the PCM memory can be read in groups of data to be compressed in different sizes than a single cycle of the data set. In such case a buffer 317 can be used to hold the current cycle data. The buffer 317 can be in the control logic to hold current cycle data. For example the buffer size could be sixteen kilobytes, while the number of bytes compressed in a group could be sixty-four bits.

The control logic can perform the following procedures. Since the number of bytes of the intermediate buffer size K may be smaller than the number of bytes in one cycle L, the data is split for one cycle into multiple groups, and K bytes processed in each group. The number of bytes to handle in the current group is then determined from K and L. The buffer is then set to zero. The control logic performs a series of steps as a loop, looping through all of the cycles to be compressed, C. The control logic points to the PCM address of the group of data for the current cycle to be compressed. The control logic increments through the groups, modifying the pointer to the PCM for each group. Each group is then compressed according to one of the above-described compression methods, wherein the compressed data comprises a status byte together with bytes having bits that have toggled in the current cycle from an adjacent cycle. The compressed group may then be stored in a buffer while other groups are compressed to form the compressed data, prior to the compressed data being transmitted to the workstation.

In an embodiment, when the user, interacting with higher-level software that may be running on the workstation, wants to upload PCM data to the workstation, the control logic may be programmed according to the above-described procedures by that higher-level software, setting the parameters used by the control logic, including C, K, L, M, N, the intermediate buffer to hold data for a previous cycle, the output buffer to hold compressed data, and the addresses to bytes in the PCM. Here, M represents the data offset in PCM for the first cycle to compress, N represents the offset increment from one cycle to the next cycle, and C, K, and L are previously defined. After setting up the control logic, the higher-level software can initiate the compression logic to compress PCM data.

According to another embodiment, the control logic can interact with parallel hardware implementations of the compression methods, such as the embodiment illustrated in FIG. 3, where a single group of eight bytes of cycle data are compressed per compression block. For example, using two implementations, two groups of eight bytes may be compressed in parallel. Any number of compression blocks can be implemented in parallel. The readout speed of the PCM usually exceeds the speed of the compression block and related logic. By implementing a plurality of compression blocks, the readout speed of the PCM may be better matched, increasing the overall speed of compression. Similarly, the speed to upload compressed data to the workstation may be better matched by changing the number of compression blocks implemented in parallel.

Because the size of the compressed data may vary depending on the bits toggled, the compression buffer used to store compressed data may be implemented as a FIFO that can accumulate compressed output bytes and flush them out of the buffer when it is full. According to an embodiment, the compressed data may be saved back to PCM. In this implementation, the PCM may be split. For example, if PCM is a DDR memory, then the DDR memory is divided into two segments. The first segment may be used to capture the uncompressed waveform data generated from the design logic being functionally verified. The second segment may be used as a temporary buffer to hold the compressed data. After compression, the compressed data may be saved to the workstation from this second segment.

Figure 6:
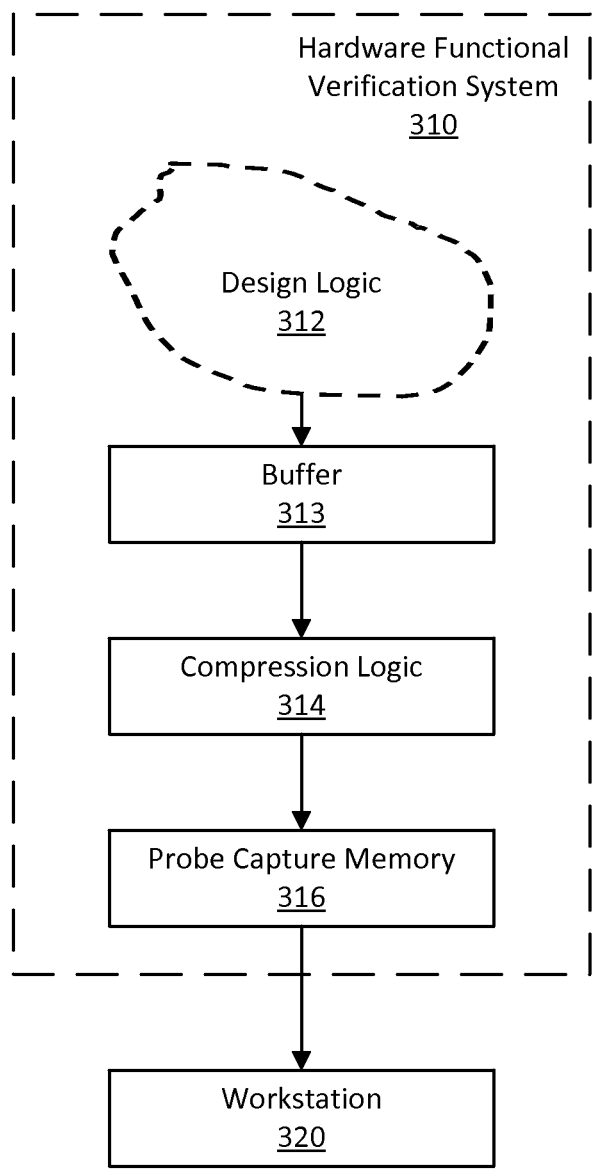
FIG. 6 is an illustration of a hardware functional verification system employing compression according to an another embodiment.

FIG. 6 illustrates an architecture for waveform data captured and compressed prior to storage in probe capture memory. Waveform data is generated from design logic 312 programmed in a hardware-based functional verification system 310. Each cycle of the system generates a raw, uncompressed data set, that is buffered into buffer 313 prior to compression. Buffer 313 should be at least large enough to hold the data of the previous cycle, as well the current cycle, for compression. The data sets are compressed by compression logic 314 prior to storage in PCM 316. PCM 316 can be RAM, such as DDR RAM, or other storage suitable for temporarily storing prior captured data. The waveform data is thus compressed according to the disclosed embodiments to increase the compression ratio prior to storage of the waveform data in the memory. For a given size of memory, compression prior to storage can increase the number of cycles of data that may be stored for a given size of storage memory. The compressed data may have a variable size. An index table may be built as the data is compressed. This index table may be used to quickly find the offset in PCM for the compressed data for every cycle. Since PCM 316 is physically located at the hardware functional verification system 310, the compressed waveform data can then be transferred to the workstation 320 so that the user can observe the data.

According to an embodiment, a compressed stream of data is decompressed on the workstation side. The decompression operation may be performed in software on the workstation side. Knowing the number of bytes in the data sets prior to compression, and possessing the status byte and any bytes having bits that toggle, the uncompressed data set can be reconstructed using data from prior cycles.

The various embodiment can be particularly effective where there are few changes in data from cycle to cycle. Prototype systems have been created using compression methods according to the disclosed embodiments. Based on exemplary circuit designs, compression ratios between five and seven times have been obtained for probe data obtained during hardware functional verification, significantly decreasing the size of data uploaded from the emulator to the user workstation.

Although various embodiments have been described with respect to specific examples and subsystems, it will be apparent to those of ordinary skill in the art that the concepts disclosed herein are not limited to these specific examples or subsystems but extends to other embodiments as well. Included within the scope of these concepts are all of these other embodiments as specified in the claims that follow.

We claim:

1. A computer-implemented method, comprising:
running a first emulation cycle for a circuit design under test to generate a first plurality of emulation bits representing waveform data captured from at least one net of the circuit design under test at a first time;
organizing the first plurality of emulation bits into a first plurality of emulation bytes;
running a second emulation cycle for the circuit design under test to generate a second plurality of emulation bits representing waveform data captured from the at least one net of the circuit design under test at a second time;
organizing the second plurality of emulation bits into a second plurality of emulation bytes;
comparing the first plurality of emulation bits with the second plurality of emulation bits to generate a plurality of result bytes containing information about which emulation bits have changed value from the first emulation cycle to the second emulation cycle;
calculating a status byte containing information about which of the second plurality of emulation bytes contain emulation bits that have changed value; and
compressing together the status byte and one of:
any one or more emulation bytes of the second plurality of emulation bytes containing bits that have changed value; or
any one or more result bytes corresponding to the any one or more emulation bytes.

2. The method of claim 1, wherein comparing the first plurality of emulation bits with the second plurality of emulation bits comprises performing an XOR operation on the first plurality of emulation bits and the second plurality of emulation bits.

3. The method of claim 1, further comprising grouping the second plurality of emulation bytes into a plurality of groups, each group containing a number of emulation bytes, wherein calculating a status byte further comprises calculating a status byte separately for each group of the plurality of groups.

4. The method of claim 1, wherein the status byte for each group of the plurality of groups comprises a number of status bits that equals the number of emulation bytes in the group.

5. The method of claim 1, wherein each emulation byte of the first plurality of emulation bytes and the second plurality of emulation bytes comprises eight emulation bits.

6. The method of claim 1, further comprising storing the first and second plurality of emulation bits in a memory before comparing the first plurality of emulation bits with the second plurality of emulation bits.

7. The method of claim 6, further comprising transmitting the compressed output for receipt by a host workstation without storing the compressed output in the memory.

8. The method of claim 1, further comprising:
storing the compressed output in a memory; and
transmitting the compressed output for receipt by a host workstation.

9. A hardware functional verification system, comprising:
a plurality emulation chips to emulate a circuit design under test and to run a plurality of emulation cycles to generate a first plurality of emulation bits representing waveform data captured from at least one net during a first emulation cycle at a first time and organized into a first plurality of emulation bytes, and to generate a second plurality of emulation bits representing waveform data captured from the at least one net during a second emulation cycle at a second time and organized into a second plurality of emulation bytes;

a comparison logic to generate a plurality of result bytes containing information about which emulation bits have changed value from the first emulation cycle to the second emulation cycle by comparing the first plurality of emulation bits to the second plurality of emulation bits;

a plurality of logic gates to calculate a status byte containing information about which of the second plurality of emulation bytes contain emulation bits that have changed value; and a compression logic to create a compressed output by compressing together the status byte and one of:
- any one or more emulation bytes of the second plurality of emulation bytes containing bits that have changed value; or
- one or more result bytes corresponding to the any one or more emulation bytes.

10. The hardware functional verification system of claim 9, wherein the comparison logic comprises one or more exclusive OR (XOR) circuits.

11. The hardware functional verification system of claim 9, wherein the plurality of logic gates to calculate a status byte comprise a plurality of OR gates.

12. The hardware functional verification system of claim 9, wherein the compression logic comprises a plurality of shift logic.

13. The hardware functional verification system of claim 9, wherein the first plurality of emulation bytes comprise eight emulation bytes, each emulation byte comprising eight emulation bits, and wherein the second plurality of emulation bytes comprise eight emulation bytes, each emulation byte comprising eight emulation bits.

14. The hardware functional verification system of claim 13, wherein the status byte comprises eight bits.

15. The hardware functional verification system of claim 13, wherein the plurality of logic gates to calculate a status byte comprise eight eight-input OR gates.

16. The hardware functional verification system of claim 9, wherein the compression logic is further configured to group the second plurality of emulation bytes into a plurality of groups, and wherein the plurality of logic gates calculate a status byte separately for each group of the plurality of groups.

17. The hardware functional verification system of claim 16, wherein the status byte for each group of the plurality of groups comprises a number of status bits that equals the number of emulation bytes in the group.

18. The hardware functional verification system of claim 9, further comprising a memory in communication with the compression logic to receive and store the compressed output.

19. The hardware functional verification system of claim 9, further comprising a memory, wherein the memory is in communication with the plurality of emulation chips to receive and store the first plurality of emulation bits and the second plurality of emulation bits, and wherein the memory is in communication with the compression logic to provide the first and second plurality of emulation bits to the compression logic.

20. The hardware functional verification system of claim 19, wherein the memory comprises a plurality of sub-memories, each sub-memory residing in an emulation chip of the plurality of emulation chips.

21. A computer-readable non-transitory storage medium having stored thereon a plurality of instructions, the plurality of instructions when executed by a computer, cause the computer to perform:

running a first emulation cycle for a circuit design under test to generate a first plurality of emulation bits representing waveform data captured from at least one net of the circuit design under test at a first time;

organizing the first plurality of emulation bits into a first plurality of emulation bytes;

running a second emulation cycle for the circuit design under test to generate a second plurality of emulation bits representing waveform data captured from the at least one net of the circuit design under test at a second time;

organizing the second plurality of emulation bits into a second plurality of emulation bytes;

comparing the first plurality of emulation bits with the second plurality of emulation bits to generate a plurality of result bytes containing information about which emulation bits have changed value from the first emulation cycle to the second emulation cycle;

calculating a status byte containing information about which of the second plurality of emulation bytes contain emulation bits that have changed value; and compressing together the status byte and one of:
- any one or more emulation bytes of the second plurality of emulation bytes containing bits that have changed value; or
- one or more result bytes corresponding to the any one or more emulation bytes.

22. The computer-readable non-transitory storage medium of claim 21, wherein comparing the first plurality of emulation bits with the second plurality of emulation bits comprises performing an XOR operation on the first plurality of emulation bits and the second plurality of emulation bits.

23. The computer-readable non-transitory storage medium of claim 21, the plurality of instructions when executed by a computer, cause the computer to further perform grouping the second plurality of emulation bytes into a plurality of groups, each group containing a number of emulation bytes, wherein calculating a status byte further comprises calculating a status byte separately for each group of the plurality of groups.

24. The computer-readable non-transitory storage medium of claim 21, wherein the status byte for each group of the plurality of groups comprises a number of status bits that equals the number of emulation bytes in the group.

25. The computer-readable non-transitory storage medium of claim 21, wherein each emulation byte of the first plurality of emulation bytes and the second plurality of emulation bytes comprises eight emulation bits.

26. The computer-readable non-transitory storage medium of claim 21, the plurality of instructions when executed by a computer, cause the computer to further perform storing the first and second plurality of emulation bits in a memory before comparing the first plurality of emulation bits with the second plurality of emulation bits.

27. The computer-readable non-transitory storage medium of claim 26, the plurality of instructions when executed by a computer, cause the computer to further perform transmitting the compressed output for receipt by a host workstation without storing the compressed output in the memory.

28. The computer-readable non-transitory storage medium of claim 21, the plurality of instructions when executed by a computer, cause the computer to further perform:
storing the compressed output in a memory; and
transmitting the compressed output for receipt by a host workstation.

* * * * *